United States Patent
Li et al.

(10) Patent No.: US 11,038,282 B2
(45) Date of Patent: Jun. 15, 2021

(54) ENERGY ABSORBING CIRCUIT

(71) Applicant: CommScope Technologies LLC, Hickory, NC (US)

(72) Inventors: Yunzhe Li, Suzhou (CN); Jinchun He, Suzhou (CN)

(73) Assignee: CommScope Technologies LLC, Hickory, NC (US)

(*) Notice: Subject to any disclaimer, the term of this patent is extended or adjusted under 35 U.S.C. 154(b) by 0 days.

(21) Appl. No.: 16/322,043

(22) PCT Filed: Sep. 29, 2017

(86) PCT No.: PCT/US2017/054280
§ 371 (c)(1),
(2) Date: Jan. 30, 2019

(87) PCT Pub. No.: WO2018/071203
PCT Pub. Date: Apr. 19, 2018

(65) Prior Publication Data
US 2019/0173197 A1   Jun. 6, 2019

(30) Foreign Application Priority Data

Oct. 11, 2016 (CN) .................. 201610887326.X

(51) Int. Cl.
*H01Q 21/00* (2006.01)
*H01P 1/26* (2006.01)
(Continued)

(52) U.S. Cl.
CPC ......... *H01Q 21/0075* (2013.01); *H01P 1/268* (2013.01); *H01P 5/227* (2013.01);
(Continued)

(58) Field of Classification Search
CPC combination set(s) only.
See application file for complete search history.

(56) References Cited

U.S. PATENT DOCUMENTS 5,467,063 A * 11/1995 Burns .................. H01P 5/12
333/125
5,625,328 A * 4/1997 Coleman, Jr. ........... H01P 5/185
333/116

(Continued)

FOREIGN PATENT DOCUMENTS

WO   02/054590 A1   7/2002
WO   2006/016973 A2   2/2006

OTHER PUBLICATIONS

International Search Report and Written Opinion of the International Searching Authority, International Application No. PCT/US2017/054280, dated Jan. 5, 2018, 14 pp.

(Continued)

*Primary Examiner* — Steven S Kelley
(74) *Attorney, Agent, or Firm* — Myers Bigel, P.A.

(57) ABSTRACT

An energy absorbing circuit includes a power divider that is configured to divide an incoming RF signal into a plurality of RF component signals; a plurality of transmission lines that are connected with the power divider, each of the transmission lines configured to transmit a respective RF component signal of the plurality of RF component signals; and a plurality of matching elements, each matching element being terminated to a respective one of the transmission lines.

14 Claims, 1 Drawing Sheet

(51) Int. Cl.
*H01P 5/22* (2006.01)
*H04B 1/40* (2015.01)
*H03F 3/21* (2006.01)
*H04B 1/04* (2006.01)
*H01Q 21/08* (2006.01)

(52) U.S. Cl.
CPC ............ *H01Q 21/08* (2013.01); *H03F 3/211* (2013.01); *H04B 1/0458* (2013.01); *H04B 1/0475* (2013.01); *H04B 1/40* (2013.01)

(56) References Cited

U.S. PATENT DOCUMENTS

| | | | | |
|---|---|---|---|---|
| 7,675,385 | B1* | 3/2010 | Mulbrook | H01P 5/12 333/101 |
| 9,263,787 | B2* | 2/2016 | Dupuy | H03D 11/08 |
| 9,570,792 | B1* | 2/2017 | Derbyshire | H01P 5/16 |
| 2003/0232600 | A1 | 12/2003 | Montgomery et al. | |
| 2004/0080455 | A1* | 4/2004 | Lee | H01Q 21/065 343/700 MS |
| 2005/0083133 | A1* | 4/2005 | Amano | H03F 1/565 330/301 |
| 2006/0028297 | A1* | 2/2006 | Kang | H01P 5/16 333/128 |
| 2007/0075802 | A1* | 4/2007 | Gruchalla | H01P 5/10 333/25 |
| 2007/0152772 | A1 | 7/2007 | Runyon | |
| 2010/0225389 | A1 | 9/2010 | Teetzel | |

OTHER PUBLICATIONS

Chinese Office Action issued in corresponding Chinese Application No. 201610887326.X (including English translation), dated Nov. 18, 2020.

* cited by examiner

ENERGY ABSORBING CIRCUIT

CROSS-REFERENCE TO RELATED APPLICATIONS

The present application is a 35 U.S.C. § 371 national stage application of PCT Application No. PCT/US2017/054280, filed on Sep. 29, 2017, which itself claims priority to Chinese Patent Application No. 201610887326X, filed on Oct. 11, 2016, the entire contents of both of which are incorporated herein by reference as if set forth in their entireties. The above-referenced PCT Application was published in the English language as International Publication No. WO 2018/071203 A1 on Apr. 19, 2018.

FIELD

The present disclosure generally relates to the field of electronic circuits and, more particularly, to energy absorbing circuits that are suitable for use in an antenna feed network.

BACKGROUND

As known in the art, resistors are widely used for circuit matching or as terminated loads to absorb undesired energy in electrical circuits such as Radio Frequency (RE) circuits. FIG. 1 is a schematic diagram of a conventional antenna feed network 10 that includes such a terminated load. As shown in FIG. 1, the antenna feed network 10 includes an energy absorbing circuit 100 and a coupler 110 such as, for example, a branch line coupler or a different type of directional coupler. The energy absorbing circuit 100 includes a transmission line 120 and a terminated resistor 130. An RF signal may pass through a port of the coupler 110, onto the transmission line 120, and then to the resistor 130. Due to non-linear characteristics of the resistor 130 and or a connection such as, for example, a soldered connection between the resistor 130 and the transmission line 120 or a soldered connection between the resistor 130 and a ground block, a new RE signal may be generated at the resistor 130 and reflected back to the coupler 110 through the transmission line 120. Such a phenomenon is referred to as Passive InterModulation (PIM) distortion.

More generally, PIM distortion is generated when two or more RE signals encounter non-linear electrical junctions or materials along an RE transmission path, Such non-linearities may act like a mixer causing the RF signals to generate new, undesired, RF signals at mathematical combinations of the original RF signals. These newly generated, undesired RF signals are often referred to as "intermodulation products." The newly generated intermodulation products may fall within the same bandwidth as desired RF signals that are being transmitted or received through the RF system. If this occurs, the noise level experienced by the desired RF signals in the receiver bandwidth is increased. When the noise level is increased, it may be necessary to reduce the data rate and/or the quality of service. PIM distortion can be an important interconnection characteristic, as PIM distortion generated by a single low quality interconnection, may degrade the electrical performance of the entire RE communications system.

The above-described intermodulation products arise because non-linear systems generate harmonics in response to sinusoidal inputs. For example, when a signal having a first frequency $S_{f1}$ is input to a non-linear system, the resulting output will include signals at integer multiples of the input frequency $S_{f1}$. When two or more signals having different frequencies are input to a non-linear system, intermodulation products arise. For example, consider a composite input signal x(t) to a non-linear system that includes signals at three different frequencies:

$$x(t) = A_1 \sin(2\pi f_1 t + \varphi_1) + A_2 \sin(2\pi f_2 t + \varphi_2) + A_3 \sin(2\pi f_3 t + \varphi_3) \quad (1)$$

In Equation (1), $A_i$ and $\varphi_i$ are the amplitudes and phases of input signals that are at three different frequencies, namely $f_1$, $f_2$, $f_3$. These input signals are passed through a non-linearity. The resulting output signal will include components at the frequencies $f_1$, $f_2$, $f_3$ of the three input signals, which are referred to as the fundamental components, as well as linear combinations of these fundamental components having the form:

$$k_1 f_1 + k_2 f_2 + k_3 f_3 \quad (2)$$

where $k_1$, $k_2$, $k_3$ are arbitrary integers which can have positive or negative values. These components are the intermodulation products and harmonics, and will have amplitudes and phases that are a function of the non-linearity and the composite input signal x(t).

The order of an intermodulation product is the SUM of the absolute value of the coefficients $k_1$, included in the intermodulation product. In the above example where the composite input signal x(t) includes signals at three different frequencies, the third order intermodulation products are the intermodulation products where:

$$|k_1|+|k_2|+|k_3|=3, \text{ where } |k_1|,|k_2|,|k_3|<3 \quad (3)$$

In the above example, the third-order intermodulation products will be at the following frequencies:

$$f_1+f_2-f_3$$

$$f_1+f_3-f_2$$

$$f_2+f_3-f_1$$

$$2f_1-f_2$$

$$2f_1-f_3$$

$$2f_2-f_1$$

$$2f_2-f_3$$

$$2f_3-f_1$$

$$2f_3-f_2$$

The odd-order intermodulation products are typically of the most interest as these products are the ones that tend to fall in the vicinity of the frequencies of the fundamental components, with the third order intermodulation products often being of primary interest.

SUMMARY

In view of above, the present disclosure proposes novel energy absorbing circuits that reduce or eliminate the effect of PIM distortion that may be caused by the energy absorbing circuits. The energy absorbing circuits according to embodiments of the present disclosure may be used, for example, in antenna feed networks.

According to one aspect of the present disclosure, an energy absorbing circuit is provided that includes a power divider that is configured to divide an incoming RF signal into a plurality of RF component signals; a plurality of transmission lines that are connected with the power divider, each of the transmission lines being configured to transmit a respective one of the RF component signals; and a plurality of matching elements, each matching element being terminated to a respective one of the transmission lines.

In one implementation, the transmission lines may be configured to have different characteristic impedances and/or lengths such that a vector sum of a plurality of PIM signals that are reflected from the respective matching elements is substantially zero at the power divider.

In one implementation, a total of two transmission lines are provided that have the same characteristic impedances but that differ in length by $\lambda/4$ or by an odd multiple of $\lambda/4$, where $\lambda$ is a wavelength of the RF signal.

In one implementation, a total of three transmission lines are provided, where first and second of the transmission lines each have a characteristic impedance that is $\sqrt{2}$ times a characteristic impedance of the third transmission line, and the first and second transmission lines have the same length while the third transmission line has a length that is $\lambda/4$ longer or an odd multiple of $\lambda/4$ longer than the length of the first and second transmission lines, where $\lambda$ is a wavelength of the RF signal.

In one implementation, the plurality of matching elements have the same characteristic.

In one implementation, the matching elements may include any of a resistor, a capacitor, an inductance and/or a Gas Discharge Tube.

In one implementation, the energy absorbing circuit is part of an antenna feed network.

BRIEF DESCRIPTION OF THE DRAWINGS

The present disclosure will be understood better from the description of specific embodiments of the disclosure given in conjunction with the following figures, wherein.

In the figures, identical or similar reference numerals indicate identical or similar elements.

DETAILED DESCRIPTION

Example embodiments of the present disclosure will now be described in more detail in conjunction with accompanying figures. Although example embodiments are shown in the accompanying figures, it should be understood that the present disclosure can be embodied in various ways and is not limited to the embodiments depicted herein. Instead, the embodiments are provided herein to make the disclosure more thorough and complete and to convey the scope of the present disclosure to those skilled in this art.

Figure 1:
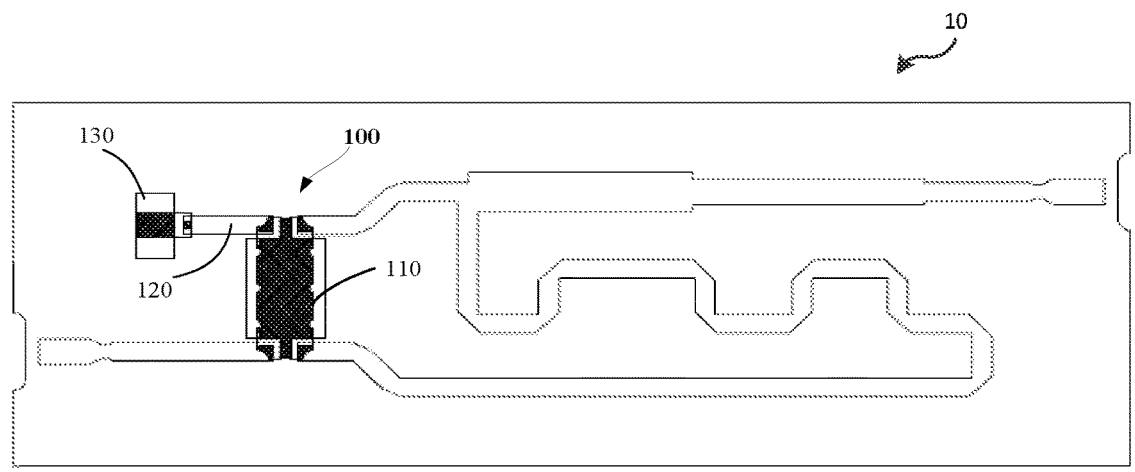
FIG. 1 is a schematic diagram of a conventional antenna feed network that includes a terminated load.
Figure 2:
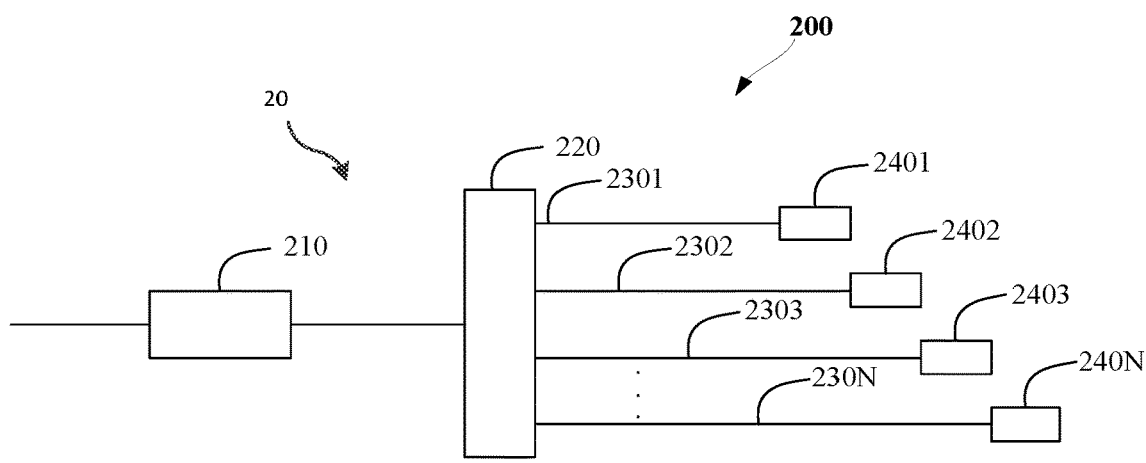
FIG. 2 is a schematic diagram of an antenna feed network according to embodiments of the present disclosure.

FIG. 2 is a schematic diagram of an antenna feed network 20 according to embodiments of the present disclosure. As shown in FIG. 2, the antenna feed network 20 includes an energy absorbing circuit 200 and a coupler 210. The coupler 210 may comprise, for example, a branch line coupler or a different type of directional coupler. The coupler 210 may comprise, for example, a four-port coupler such as the coupler shown in FIG. 1. The energy absorbing circuit 200 includes a 1:N power divider 220 that has an input and a plurality of outputs, a plurality of transmission lines 2301, 2302, 2303, . . . , 230N (collectively transmission lines 230) and a plurality of matching elements 2401, 2402, 2403, . . . , 240N (collectively matching elements 240). The 1:N power divider 220 is configured to divide an RF signal that is received from the coupler 210, for example, into a plurality of RF component signals (i.e., N RF component signals), which are transmitted through the N transmission lines 230 (or branches) that are connected with the power divider 220, where N is a positive integer equal to or greater than 2. Each of the transmission lines 230 has one end connected to a respective output of the power divider 220 and has the other end terminated to a respective one of the matching elements 240. Any of, a wide variety of different types of transmission line may be used to implement the transmission lines 230 (e.g., any appropriate transmission path for an RF signal). Each matching element 240 may be used to absorb the energy of the RF component signal that is transmitted through the respective transmission line 230 that is attached thereto.

By dividing the power of an incoming RF signal into N portions with the power divider 220, each of the RF component signals that is received at a respective matching element 240 is decreased in power relative to the original RF signal, and therefore the PIM distortion generated at each matching element 240 may be much smaller than that of the original RF signal. As an example, if the power divider 220 is a 1:2 power divider which equally divides the incoming RF signal into two RF component signals that have the same power, the incident energy to each matching element 240 will be decreased by 3 dB and thereby the generated third order PIM will be decreased by 9 dB theoretically.

Furthermore, the transmission lines 2301, 2302, 2303, . . . , 230N may be configured to have different characteristic impedances and/or lengths such that the vector sum of the reflected PIM signals at the power divider is reduced. In particular, the transmission lines 230 may be configured so that the reflected PIM signals that are received at the power divider 220 tend to cancel each other out. In some embodiments, the energy absorbing circuit may be designed so that a vector sum of the third order PIM signals that are received at the input to the power divider 220 from the matching elements 240 in response to an RF signal that is incident at the input to the power divider 220 is less than half the sum of the magnitudes of the third order PIM signals. In other embodiments, more enhanced cancellation may be achieved so that the vector sum of the third order PIM signals received at the input to the power divider 220 from the matching elements 240 in response to the RF signal that is incident at the input to the power divider 220 is less one tenth the sum of the magnitudes of the third order PIM signals. In still other embodiments, the vector sum of the all of the PIM signals received at the power divider 220 may be substantially equal to zero. The actual amount of PIM reduction or cancellation that is achieved may depend on a variety of factors including the power split of the power divider 220, the characteristic of each matching element 240, the lengths and/or characteristic impedances of each branch and/or other factors that may affect the magnitude and/or phase of each PIM signal.

At least some of the transmission lines 230 may have different phase delays than other of the transmission lines 230. Herein, a "phase delay" of a transmission path refers to an amount a phase of an RF signal having a certain wavelength changes when traversing the transmission path. In some embodiments, the difference in the phase delay between two different transmission paths 230 may be set to be about 180 degrees for RF signals having a certain, pre-selected wavelength. This may cause PIM signals that travel from the matching elements 240 connected to the transmission paths 230 back to the power divider 220 to destructively combine at the power divider 220, thereby reducing the overall amount of PIM distortion. If two such PIM signals that have a phase delay difference of 180 degrees also have equal magnitudes, then the two PIM signals may substantially cancel each other out at the power divider 220. More generally, in some embodiments, the magnitudes of the RF component signals and the phase delays of the transmission lines 230 may be set so that the PIM distortion signals received at the power divider 220 from the matching elements may cancel each other out, either substantially completely or to a lesser degree.

Herein, the "characteristic" of a matching element 240 refers to the capability of the matching element 240 to generate PIM distortion with respect to the same input RF component signal. For example, if all of the matching elements 240 are electronic elements of the same type (e.g., resistors), they may be regarded as, having the same characteristic. In one implementation, each matching element 240 may be implemented as a resistor. However, the present disclosure is not limited thereto and the type of the matching element 240 may also include, for example, any of a capacitor, an inductance and a Gas Discharge Tube (GDT), or combinations thereof.

The present application primarily focuses on the case where the matching element 240 for each branch is the same. This is because from the viewpoint of PIM reduction, when the characteristic of the matching element 240 of one branch is definite, the easiest and most efficient way to achieve PIM reduction may be to use matching elements 240 with the same characteristic on the other branches, in substance, in some of the most important applications of the embodiments of the present disclosure, the characteristic of the PIM distortion source in the existing solution should be determined firstly (for example, it is determined that the PIM distortion source is a resistor in FIG. 1), and then the transmission line 230 is divided and a matching element 240 with the same characteristic (i.e., a resistor) is used in the other branch. However, it will be appreciated that the techniques disclosed herein may also be used in energy absorbing circuits that use two or more different types of matching elements 240.

If the characteristics of the matching elements 240 are the same, the PIM signal generated at each matching element 240 may have a same phase difference from the input RF component signal. If it is assumed that the 1:N power divider 220 divides the input RF signal into N RF component signals, the magnitude of the PIM signal generated at each matching element 240 is in proportion to power of the RF component signal distributed to the matching element 240 by the power divider 220. Therefore, the length and/or characteristic impedance (which decides the power of the RF component signal of the corresponding transmission line 230) of each transmission line 230 may be configured to ensure that the vector sum of the PIM signals reflected back to the power divider 220 will be significantly reduced or reduced to be substantially zero.

In one example, N equals 2, and the transmission line 2302 and the transmission line 2301 may be configured to have the same characteristic impedance (such as the same width, thereby the power of the RF component signal on the transmission line 2302 is equal to that on the transmission line 2301) and the difference of their lengths may be configured to be $\lambda/4$ or an odd multiple of $\lambda/4$, where is the wavelength of the RF signal input to the power divider 220.

In another example, N equals 3, and if the characteristic impedance of the transmission line 2301 is configured to be $1/\sqrt{2}$ the characteristic impedance of transmission lines 2302 and 2303 (thereby the power of the RF component signals on the transmission lines 2301, 2302 and 2303 are $\frac{1}{2}P$, $\frac{1}{4}P$ and $\frac{1}{4}P$, respectively, where P is the power of the RF signal input to the power divider 220 and the power divider 220 is assumed to be lossless), the transmission lines 2302 and 2303 may be configured to have the same length and the difference between the length of the transmission lines 2302 and 2303 and the length of the transmission line 2301 may be configured to be $\lambda/4$ or an odd multiple of $\lambda/4$, where $\lambda$ is the wavelength of the RF signal.

Figure 3:
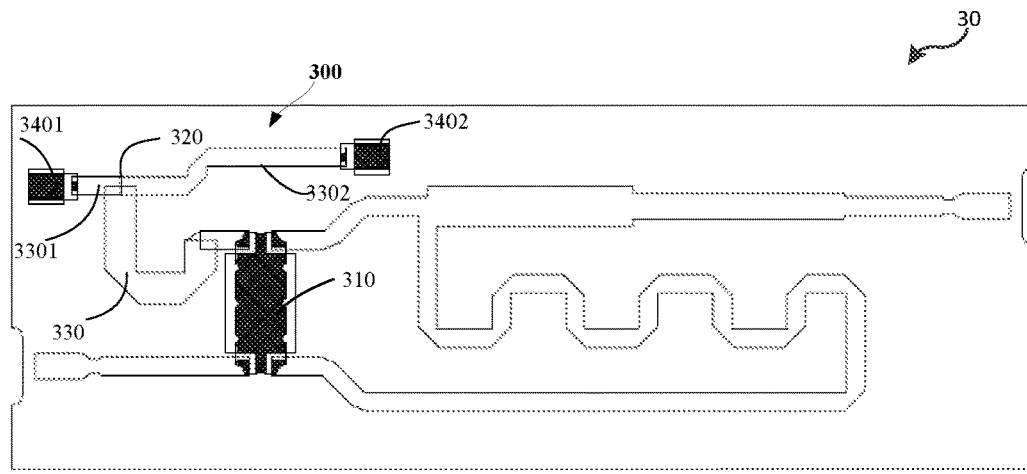
FIG. 3 is a schematic diagram of an example implementation of an antenna feed network according to an embodiment of the present disclosure.

FIG. 3 illustrates a schematic diagram of an antenna feed network 30 according to an embodiment of the present disclosure. As shown in FIG. 3, the antenna feed network 30 includes an energy absorbing circuit 300 and a coupler 310. The energy absorbing circuit 300 includes a 1:2 power divider 320, two transmission lines 3301, 3302, and two matching elements 3401, 3402. The 1:2 power divider 320 is configured to equally divide the RF signal from the coupler 310 into two RF component signals, which are transmitted through the respective transmission lines (or branches) 3301 and 3302. Each of the transmission lines 3301 and 3302 has one end connected to the power divider 320 and has the other end terminated to a respective one of the matching elements 3401, 3402. The matching elements 3401 and 3402 are used to absorb the energy of the RF component signals transmitted through the respective transmission lines 3301, 3302.

The energy absorbing circuit 300 of FIG. 3 may be regarded as a specific example of the energy absorbing circuit 200 of FIG. 2 when N equals 2 and the transmission line 3301 has the same width as the transmission line 3302. In this ease, the difference between the length of the transmission line 3302 and the length of the transmission line 3301 may be configured to be $\lambda/4$ or odd multiples of $\lambda/4$, where $\lambda$ is the wavelength of the RE signal.

After simulation and test, it was found that the implementation of FIG. 3 may reduce the third order VIM from −138 dDc to −160 dDc.

The above depiction is provided to enable those skilled in the art to implement or use the present disclosure. For those skilled in the art, various modifications of the present disclosure are apparent, and the general principle defined herein may also be applied to other transformations without departing from the spirit and scope of the present disclosure. Thus, the present disclosure is not limited to the examples and designs as described herein, but should be consistent with the broadest scope of the principle and novel characteristics thereof.

What is claimed is:

1. An energy absorbing circuit comprising:
   a coupler comprising an input, a first output, and a second output, wherein the first output is configured to be coupled to an antenna;
   a power divider having a plurality of outputs and an input coupled to the second output of the coupler, the power divider configured to divide a Radio Frequency (RF) signal that is received at the input of the power divider from the coupler into a plurality of RF component signals;
   a plurality of transmission lines that are each separately connected to the respective outputs of the power divider, each of the transmission lines being configured to transmit a respective one of the RF component signals; and a plurality of matching elements, each matching element being terminated to a respective one of the transmission lines, wherein every output of the power divider is coupled to a respective one of the matching elements, wherein a first transmission line of the plurality of transmission lines is configured to have a first characteristic impedance and/or a first length and a second transmission line of the plurality of transmission lines is configured to have a second characteristic impedance and/or a second length such that a first PIM signal of the first transmission line destructively combines with a second PIM signal of the second transmission line at the power divider, wherein the first characteristic impedance is the same as the second characteristic impedance, and wherein a difference in the first length and the second length is configured to be $\lambda/4$ or an odd multiple of $\lambda/4$, where $\lambda$ is a wavelength of the RF signal.

2. The energy absorbing circuit according to claim 1, wherein the plurality of matching elements have the same characteristic impedance.

3. The energy absorbing circuit according to claim 1, wherein a type of the plurality of matching elements includes any of a resistor, a capacitor, an inductance and a Gas Discharge Tube.

4. The energy absorbing circuit according to claim 1, wherein the energy absorbing circuit is part of an antenna feed network.

5. The energy absorbing circuit according to claim 1, wherein the first PIM signal is generated by a first matching element of the plurality of matching elements that terminates the first transmission line based on a reflection of a first RF component signal of the plurality of RF component signals that is output by the power divider onto the first transmission line.

6. An energy absorbing circuit of an antenna feed network comprising:
a coupler comprising an input, a first output, and a second output, wherein the first output is configured to be coupled to an antenna, and the input of the coupler is coupled to an input of the antenna feed network;
a power divider comprising a plurality of outputs and an input coupled to the second output of the coupler, the power divider configured to divide an incoming Radio Frequency (RF) signal from the coupler into a plurality of RF component signals;
a plurality of transmission lines that are each separately connected to the respective outputs of the power divider, each of the transmission lines being configured to transmit a respective one of the RF component signals; and
a plurality of matching elements, each matching element being terminated to a respective one of the transmission lines,
wherein the plurality of transmission lines have characteristic impedances and/or lengths such that Passive Intermodulation Distortion (PIM) signals reflected from each of the matching elements destructively combine at the power divider and a vector sum of the PIM signals is substantially zero at the power divider,
wherein the plurality of transmission lines includes two transmission lines, and the two transmission lines are configured to have the same characteristic impedance and a difference of their lengths is configured to be $\lambda/4$ or an odd multiple of $\lambda/4$, where $\lambda$ is a wavelength of the RF signal.

7. The energy absorbing circuit according to claim 6, wherein the PIM signals reflected from each of the matching elements are generated in response to the respective one of the RF component signals that is output by the power divider onto the respective one of the transmission lines that is terminated by the matching element.

8. An energy absorbing circuit comprising:
a coupler comprising an input, a first output, and a second output, wherein the first output is configured to be coupled to an antenna;
a power divider having a plurality of outputs and an input coupled to the second output of the coupler, the power divider configured to receive a Radio Frequency (RF) signal at the input to the power divider that is separate from a signal transmitted to the antenna; and
a plurality of matching elements that are each separately coupled via respective transmission paths to the respective outputs of the power divider,
wherein the transmission paths and matching elements are configured so that third order Passive Intermodulation Distortion (PIM) signals received at the input to the power divider from each of the matching elements via the respective transmission paths in response to the RF signal that is incident at the input to the power divider destructively combine with one another and a vector sum of the third order PIM signals is less than half a sum of magnitudes of the third order PIM signals,
wherein the transmission paths are configured to have the same characteristic impedance and a difference of their lengths is configured to be $\lambda/4$ or an odd multiple of $\lambda/4$, where $\lambda$ is a wavelength of the RF signal.

9. The energy absorbing circuit according to claim 8, wherein the vector sum of the third order PIM signals received at the input to the power divider from the matching elements in response to the RF signal that is incident at the input to the power divider is less than one tenth the sum of the magnitudes of the third order PIM signals.

10. The energy absorbing circuit according to claim 8, wherein each matching element comprises a resistor.

11. The energy absorbing circuit according to claim 8, wherein a first of the transmission paths has a different phase delay than a second of the transmission paths.

12. The energy absorbing circuit according to claim 11, wherein a phase delay of the first of the transmission paths differs from the phase delay of the second of the transmission paths by about 180 degrees.

13. An energy absorbing circuit comprising:
a coupler comprising an input, a first output, and a second output, wherein the first output is configured to be coupled to an antenna;
a power divider comprising a plurality of outputs and an input coupled to the second output of the coupler;
a plurality of energy absorbing elements that are each separately coupled to the respective outputs of the power divider; and
a plurality of transmission paths that each separately connect the outputs of the power divider to the respective energy absorbing elements,
wherein characteristic impedances and/or lengths of the transmission paths are configured so that a plurality of PIM signals generated by the respective energy absorbing elements in response to a Radio Frequency (RF) signal that is input to the power divider substantially cancel each other out when they are received at the power divider over the respective transmission paths,
wherein the transmission paths are configured to have the same characteristic impedance, and wherein a first of the transmission paths has a length that is x*λ/4 longer than a second of the transmission paths, where x is an integer greater than or equal to 1 and λ is the wavelength of the RF signal.

14. The energy absorbing circuit according to claim 13, wherein a phase delay of the first of the transmission paths differs from the phase delay of the second of the transmission paths by about 180 degrees.

* * * * *